(12) United States Patent
Lopergolo et al.

(10) Patent No.: US 6,197,171 B1
(45) Date of Patent: Mar. 6, 2001

(54) PIN CONTACT MECHANISM FOR PLATING PIN GRID ARRAYS

(75) Inventors: Emanuele F. Lopergolo, Marlboro; Mark A. Brandon; Arden S. Lake, both of Poughkeepsie; Joseph M. Sullivan, Jr., Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,133

(22) Filed: Mar. 31, 1999

(51) Int. Cl.$^7$ .................................................. C25B 9/00
(52) U.S. Cl. .................. 204/288.3; 204/280; 204/286.1; 204/297.1; 204/297.12; 204/297.14; 204/297.09; 439/66
(58) Field of Search .............................. 204/297.14, 280, 204/286.1, 297.01, 297.12, 297.09, 297.1, 288.3; 439/66

(56) References Cited

U.S. PATENT DOCUMENTS

| | | | |
|---|---|---|---|
| 3,432,423 | * 3/1969 | Zavitz | 204/297.14 |
| 4,405,410 | 9/1988 | Sebastien | 204/15 |
| 4,615,573 | * 10/1986 | White et al. | 29/843 |
| 5,022,976 | * 6/1991 | Röll et all. | 204/297.01 |
| 5,342,992 | 8/1994 | Noto | 174/52.4 |
| 5,459,102 | * 10/1995 | Shibata et al. | 437/209 |
| 5,486,377 | 1/1996 | Hamuro et al. | 427/79 |
| 5,516,416 | 5/1996 | Canaperi et al. | 205/78 |
| 5,580,432 | 12/1996 | Shibata et al. | 204/297 R |
| 5,714,051 | 2/1998 | Van Leth et al. | 205/122 |
| 5,869,139 | * 2/1999 | Biggs et al. | 204/297.01 |
| 5,871,626 | * 2/1999 | Crafts et al. | 204/297.01 |
| 5,871,629 | * 2/1999 | Watts | 204/297.01 |
| 5,967,797 | * 10/1999 | Maldonado | 439/66 |
| 6,045,367 | * 4/2000 | Maldonado | 439/66 |
| 6,051,119 | * 4/2000 | Findeis et al. | 204/297.01 |

* cited by examiner

*Primary Examiner*—Bruce F. Bell
(74) *Attorney, Agent, or Firm*—Ratner & Prestia; Ira D. Blecker, Esq.

(57) ABSTRACT

An apparatus and process for electroplating a pin grid array device having a plurality of pins, the pins having a side surface and an extremity. The apparatus comprises a contact plate defining a plane and having a plurality of electrically conductive flexible contact fingers extending from the contact plate away from the plane, the contact fingers adapted to flex when contacted by the pins. The process comprises contacting each of the plurality of pins with a flexible contact finger extending from a single electrically conductive plate, the conductive plate defining a plane, wherein the flexible contact fingers extend away from the plane.

15 Claims, 4 Drawing Sheets

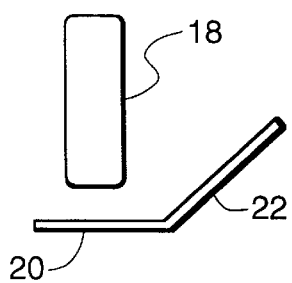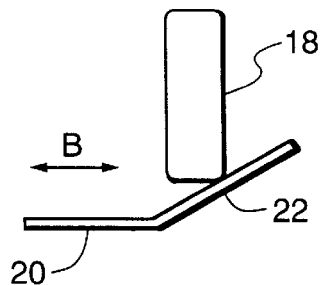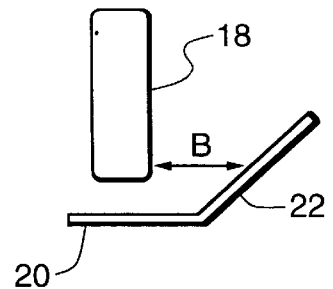
Fig. 5A   Fig. 5B   Fig. 5C
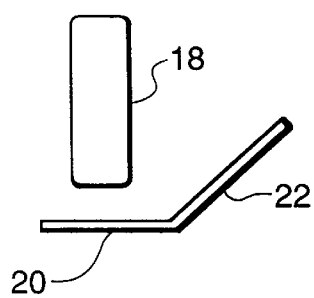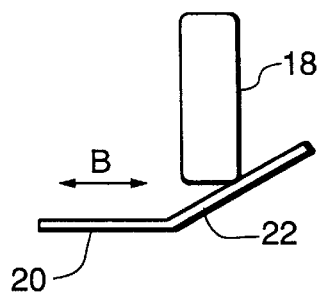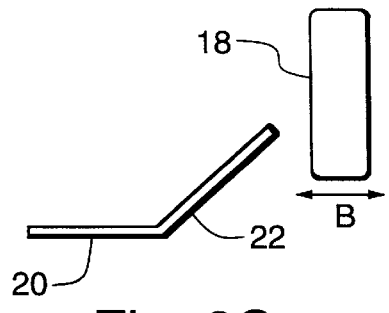
Fig. 6A   Fig. 6B   Fig. 6C
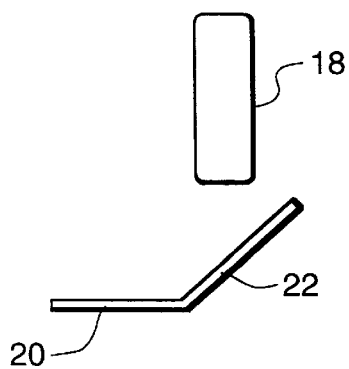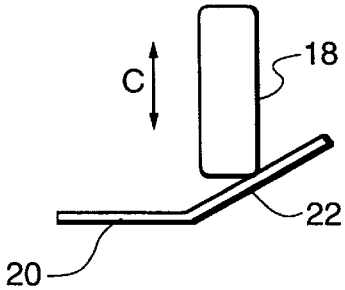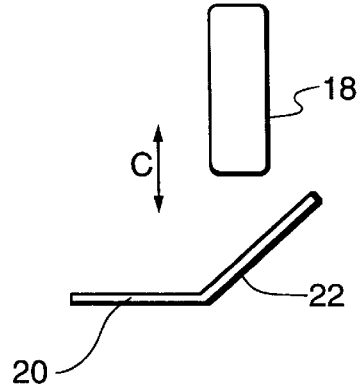
Fig. 7A   Fig. 7B   Fig. 7C

PIN CONTACT MECHANISM FOR PLATING PIN GRID ARRAYS

TECHNICAL FIELD

The present invention relates generally to an apparatus and a method for manufacturing an integrated circuit package. More specifically, the invention relates to a device and an assembly method for fabricating pin grid array packages using a pin contact mechanism.

BACKGROUND OF THE INVENTION

Many electronic devices, such as integrated circuits, use a pin grid array (PGA) package as the plug-in type package. Pin grid array packages provide for easy insertion and removal of a device that is plugged into a socket mounted in the product assembly. Pin grid array packages have a plurality of conductive pins which are used to form the leads for an electronic device package. These pins are typically plated to provide the desired electrical and mechanical characteristics of the pins, including enhanced solder ability, enhanced conductivity, and immunity to wear and corrosion.

Typically, an electroplating process is used to plate the pins. The electroplating process comprises electrically connecting the pins of the pin grid array package and subjecting the pins to a plating bath. The pins are physically contacted with an electrical conductor to electrically connect the pins to a current source. The physically contacted portion of the pin is not exposed to the plating bath because the plating solution is blocked by the contacting conductor. As a result, the method used to electrically connect the pins is critical to ensuring that the desired areas of the pins are sufficiently plated. One must carefully choose the contact spot on the pin, however, so as to plate the desired areas of the pins.

In addition, the plating bath must be kept in constant motion during electroplating. Such motion helps to prevent excessive change in the local concentration of the bath due to plate-out depletion. A corollary requirement is an unimpeded flow of plating chemical around the pins to be plated. Again, this requirement imposes restrictions on how the connection is made to the pins.

In the past, several methods have been developed to electrically connect the pins of pin grid array packages during the electroplating process. One method weaves wires between the pins, contacting the pins on alternate sides, to electrically connect the pins. Unfortunately, this is a slow method and it is prone to poor electrical connection of the pins. Furthermore, it is difficult to position the wires such that they do not contact areas of the pin that need to be plated.

A second method of electrically connecting the pins involves welding a conductive plate to the pin tips. Unfortunately, this method requires additional steps, such as aligning, welding, and removing the plate after the plating process, thereby increasing expense and time. Furthermore, the welded plate is not reusable. In another method, the pins are pressed into a conductive foil backed by a compliant member. Unfortunately, the conductive foil backing is typically a solid face. This solid face inhibits the flow of the plating bath around the pins and reduces pin plating.

Another method used for electrically connecting the pins of a pin grid array package incorporates a rigid mesh plate. This rigid plate is formed such that the pins are form-fitted into the plate, providing multiple contacts which press against the pin shank to provide electrical connection. Although this method typically improves the electrical connection of the pins over the method of weaving wires around the pins, large areas of the pins are left unplated as a result of multiple contacts to each pin. In addition, removal of the mesh plate after plating causes substantial damage to the pins, the plated surface, or both.

Related U.S. Pat. No. 5,459,102 and No. 5,580,432 issued to Shibata et al. describe a method of electrically connecting pins of an integrated circuit package by force-fitting each pin into a planar force-fit opening in a conductive jig. Using this method, the pin side surfaces are physically contacted by the force-fit opening to gain electrical connection. The edges of the force-fit opening section are resiliently deformable outward to receive and hold the pin. This flexibility is accomplished by forming vacant openings adjacent the walls of the force-fit opening.

Although this method improves reliability by assuring contact to the pins, the pins and plate surfaces are often damaged when removing the pins from the force-fit opening, which has a limited degree of flexibility and requires significant force to contact the pins. In addition, the plating jig requires a minimal thickness to maintain structural stability during plating, which increases the contact area between the force-fit opening and the pins, and thereby increases the area of the pin left unplated. Furthermore, the plating jig, which consists largely of a solid face, inhibits flow of the plating bath to the pins, which results in under plating of the pins.

The deficiencies of the use of conventional methods to provide an electrical connection to the pins of pin grid array packages during the electroplating process show that a need still exists for electrically connecting the pins on a pin grid array package that provides less physical contact, is more reliable, and is cost effective. An object of the present invention is to provide a way to electrically connect the pins of pin grid array packages during the electroplating process which electrically connects the pins with less physical contact, requires less force to insert and remove, and which is reuseable.

SUMMARY OF THE INVENTION

To achieve this and other objects, and in view of its purposes, the present invention provides an apparatus for electroplating a pin grid array device having a plurality of pins. Using the apparatus of the invention, the pins of the pin grid array device are electrically connected with less physical contact during the electroplating process. In addition, following electroplating, the apparatus of the invention reduces damage to the pin caused by removal of the pin from the apparatus after electroplating.

The present invention is an apparatus for electroplating a pin grid array device having a plurality of pins, the pins having a side surface and an extremity. The apparatus comprises a contact plate defining a plane and having a plurality of electrically conductive flexible contact fingers extending from the contact plate away from the plane of the contact plate. The contact fingers are adapted to flex when contacted by the pins.

In one embodiment, the flexible contact fingers are positioned such that each of the plurality of pins contacts one flexible contact finger at the pin extremity. In a second embodiment, the flexible contact fingers are positioned such that each of the plurality of pins contacts one flexible contact finger at the pin side surface. In a third embodiment, the flexible contact fingers are positioned such that each of the plurality of pins contacts two flexible contact fingers at the pin side surface.

The present invention also relates to a process for electroplating a plurality of pins extending from an integrated circuit package. The process comprises contacting each of the plurality of pins with a flexible contact finger extending from a single electrically conductive plate. The conductive plate defines a plane and the flexible contact fingers extend away from the plane.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIGS. 5A, 5B, and 5C show in schematic representation a pin in a disengaged position, engaged position, and disengaged position, respectively;

FIGS. 6A, 6B, and 6C show in schematic representation a pin in a disengaged position, engaged position, and disengaged position, respectively;

FIGS. 7A, 7B, and 7C show in schematic representation a pin in a disengaged position, engaged position, and disengaged position, respectively;

DETAILED DESCRIPTION OF THE INVENTION

The invention will next be illustrated with reference to the figures in which similar numbers indicate the same elements in all figures. Such figures are intended to be illustrative, rather than limiting, and are included to facilitate the explanation of the apparatus of the present invention. The apparatus of the invention comprises a contact plate having flexible contact fingers which contact the pins of a pin grid array device to provide electrical connection during the electroplating process.

Figure 1:
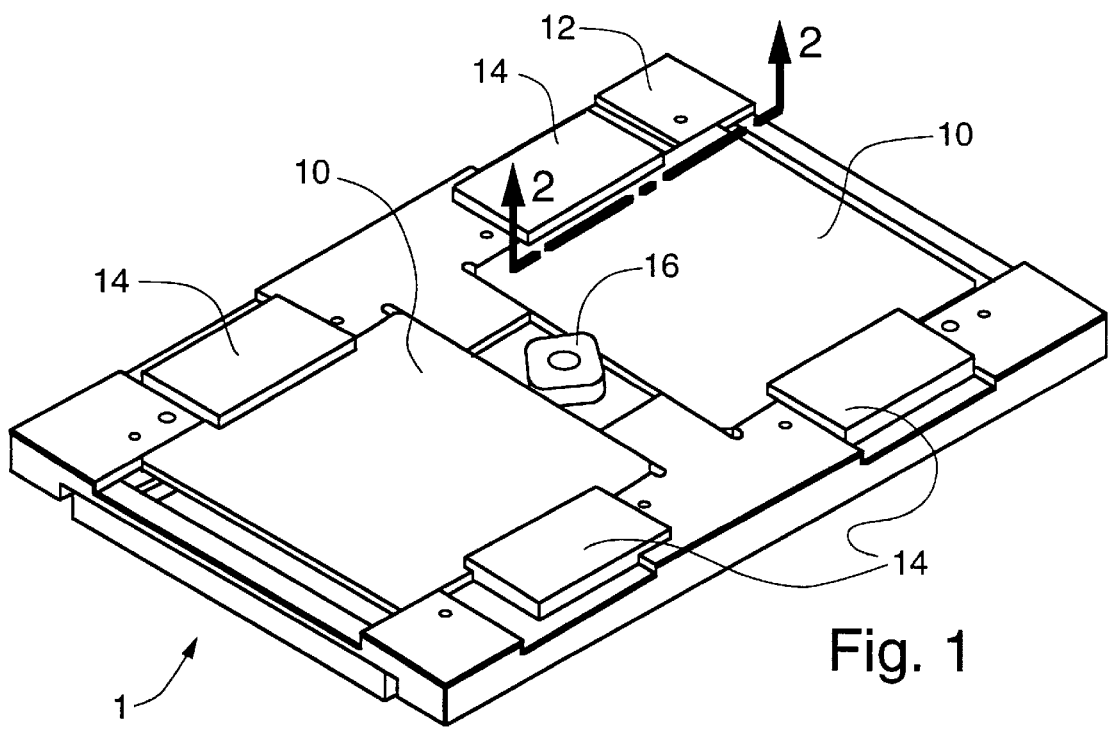
FIG. 1 shows in schematic representation an exemplary embodiment of the apparatus for electroplating a pin grid array device of the present invention.

Referring to FIG. 1, an apparatus 1 for electroplating a pin grid array device 10 will first be described. In general, electroplating apparatus 1 requires a tank containing an electroplating solution, and a power supply for supplying the electrical current required to perform electroplating. These elements are well known in the art and are not illustrated. The electroplating apparatus 1 further includes a carrier frame 12, a device positioning clamps 14, and a positioning system 16 for positioning the contact plate. The carrier frame 12 and device positioning clamps 14 serve to hold the device 10 during the electroplating process. The positioning system 16 positions the device 10 within the electroplating apparatus 1. The positioning system 16 can be selected from those conventionally used, such as camming systems or systems including an elastomeric material, as this component is not critical to the invention.

Figure 2:
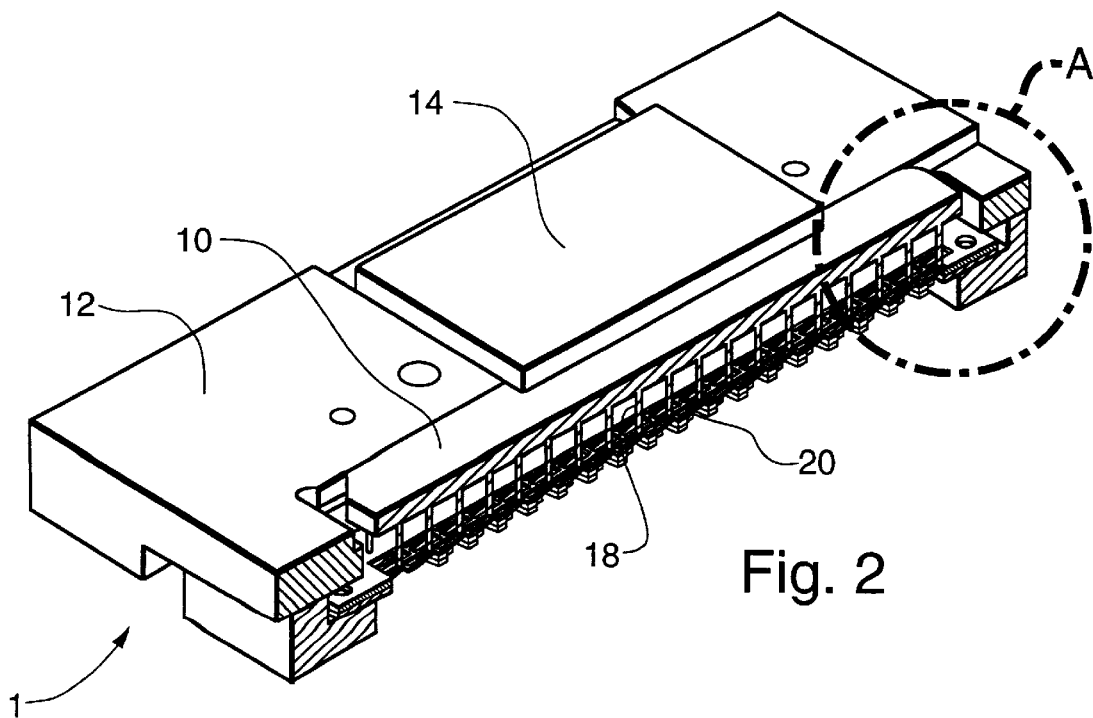
FIG. 2 shows in schematic representation a cross-sectional view of the embodiment of FIG. 1 taken along the line 2—2 of FIG. 1.
Figure 3:
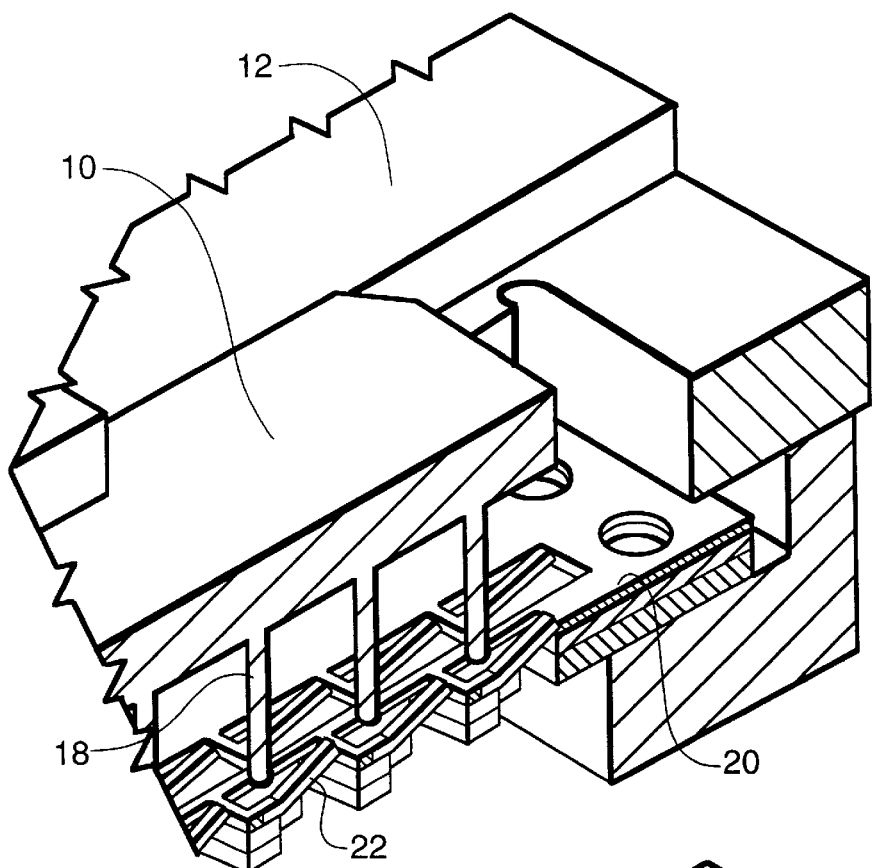
FIG. 3 shows in schematic representation an enlarged view of the area A of FIG. 2, illustrating the apparatus of the invention in a disengaged position.

FIG. 2 is a cross-sectional view of the apparatus 1 taken along line 2—2 of FIG. 1. FIG. 2 shows pins 18 of the device 10 to be plated and a contact plate 20. The apparatus 1 is also illustrated as having a carrier frame 12, a device positioning clamps 14, and a positioning system 16. The contact plate has a plurality of contact fingers 22 as shown in FIG. 3.

Figure 4:
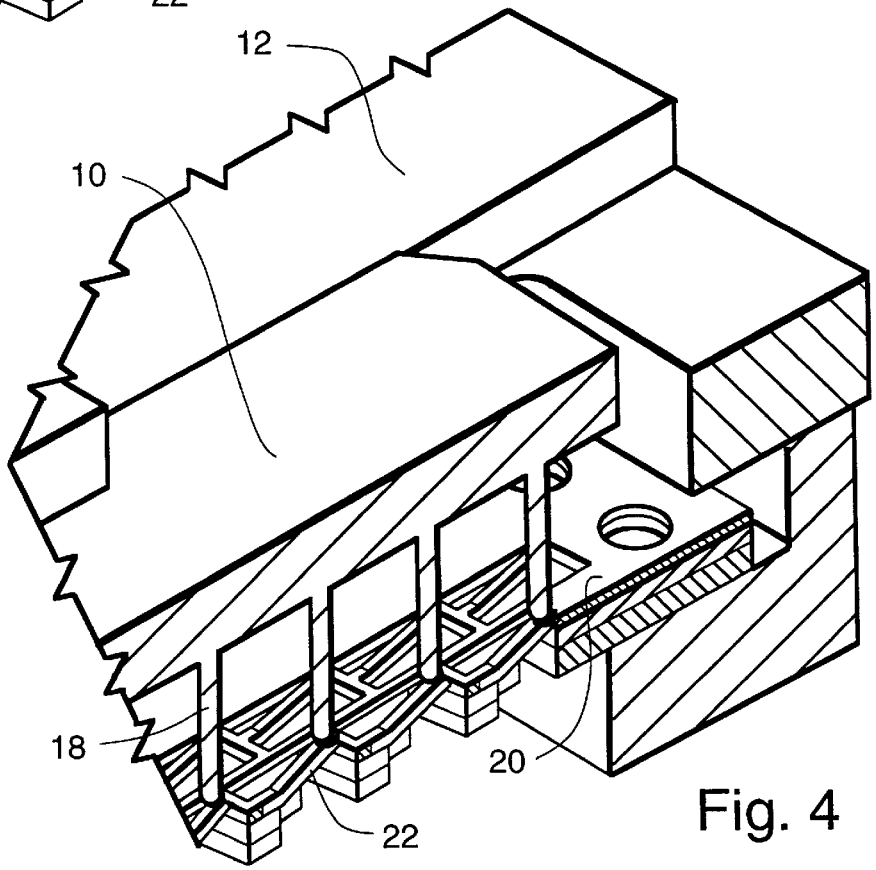
FIG. 4 shows in schematic representation an enlarged view of the area A of FIG. 2, illustrating the apparatus of the invention in an engaged position.

The pins 18 of the device 10 are positioned in two stages within the apparatus 1 of the present invention. First, as illustrated in FIG. 3, the pins 18 are inserted into the apparatus 1 such that the pins 18 do not contact the flexible contact fingers 22 of the contact plate 20. Second, as illustrated in FIG. 4, the pins 18 are positioned such that they engage the flexible contact fingers 22. As used in this application, the term "engaged" is intended to describe physical contact between a pin 18 and at least one flexible contact finger 22.

During the electroplating process, the pins 18 sought to be electroplated are electrically connected to a power source. This connection can be accomplished by contacting the pins 18 to the flexible contact fingers 22 of the contact plate 20 and by connecting the contact plate 20 to a power source to provide the electrical connection. First, the pins 18 are inserted into the apparatus 1 such that the pins 18 do not physically contact the contact fingers 22. Next, physical contact between the pins 18 and the flexible contact fingers 22 is accomplished by moving the pins 18, the flexible contact fingers 22, or both components such that the pins 18 and contact fingers 22 become engaged.

The pins 18 are moved from the disengaged position to the engaged position, using the positioning system 16, to drive the pins 18 to engage the contact fingers 22. Preferably, the pins 18 are positioned in the engaged position by movement laterally in a direction substantially perpendicular to the axis of the pins 18. While in the engaged position, the contact plate 20 is connected with an external power source, in the same manner as the conventional electroplating process, in a plating tank containing a plating bath to conduct electroplating.

Following electroplating, the pins 18 are then separated from the flexible contact fingers 22 into a disengaged position using the positioning system 16. Preferably, the pins 18 are separated from the contact fingers 22 after electroplating by movement laterally in a direction substantially perpendicular to the axis of the pins 18.

The contact plate 20 of the apparatus 1 of the present invention is made of conventional conductive materials, such as stainless steel. The flexible contact fingers 22 of the apparatus 1 are fabricated on the contact plate 20 by etching or stamping out processes, in which the flexible contact fingers 22 are arranged at predetermined length-wise and breadth-wise pitches corresponding to the arrangement of the pins 18. The flexible contact fingers 22 are preferably non-planar with the contact plate 20, as illustrated in FIGS. 5A–5C, 6A–6C, and 7A–7C. FIGS. 5A through 7C illustrate methods of engaging and disengaging the pins 18.

FIGS. 5A, 5B, and 5C illustrate a pin 18 in a disengaged position, engaged position, and disengaged position, respectively. Movement from position to position occurs in a lateral direction (see arrow B). As illustrated in FIG. 5A, the pin 18 is first positioned in a first position, in which the pin 18 is disengaged. Next, as illustrated in FIG. 5B, the pin 18, the flexible contact finger 22, or both is or are moved laterally along the direction of arrow B to a second position, in which the flexible contact finger 22 engages the pin 18. In the engaged position, the flexible contact finger 22 of the contact plate 20 is compressed by the pin 18.

As used in this application, "flexible" is intended to mean compressed, flexed, bent, or deflected when pressure is applied, such as when spring loaded, making it possible to attain fitting and removal of the pins 18 with less force. The flexibility of the contact fingers 22 enables pins 18 of differing lengths and circumferences to be contacted by the flexible contact fingers 22. After electroplating, the pin 18, the flexible contact finger 22, or both components is or are moved in a reverse lateral direction to the first position, disengaging the pin 18, as illustrated in FIG. 5C.

FIGS. 6A, 6B, and 6C illustrate a pin 18 in a disengaged position, engaged position, and disengaged position, respectively, in which movement occurs in the same lateral direction B. As illustrated in FIG. 6A, the pin 18 is first positioned in a disengaged position. Next, the pin 18, the flexible contact finger 22, or both components is or are moved in a lateral direction, such that the flexible contact finger 22 engages the pin 18, as illustrated in FIG. 6B. In the engaged position, the flexible contact finger 22 of the contact plate 20 is compressed by the pin 18. After electroplating, the pin 18, the flexible contact finger 22, or both components is or are then moved in the same lateral direction to a third position, disengaging the pin 18, as illustrated in FIG. 6C.

FIGS. 7A, 7B, and 7C illustrate a pin 18 in a disengaged position, engaged position, and disengaged position, respectively, in which movement from position to position occurs in a vertical direction (see arrow C). As illustrated in FIG. 7A, the pin 18 is first positioned in a disengaged position. Next, the pin 18, the flexible contact finger 22, or both components is or are moved in a vertical direction to a second position, such that the flexible contact finger 22 engages the pin 18. In the engaged position, the flexible contact finger 22 of the contact plate 20 is compressed by the pin 18. After electroplating, the pin 18, the flexible contact finger 22, or both components is or are then moved in a reverse vertical direction to the first position, as illustrated in FIG. 7C, disengaging the pin 18.

Figure 8:
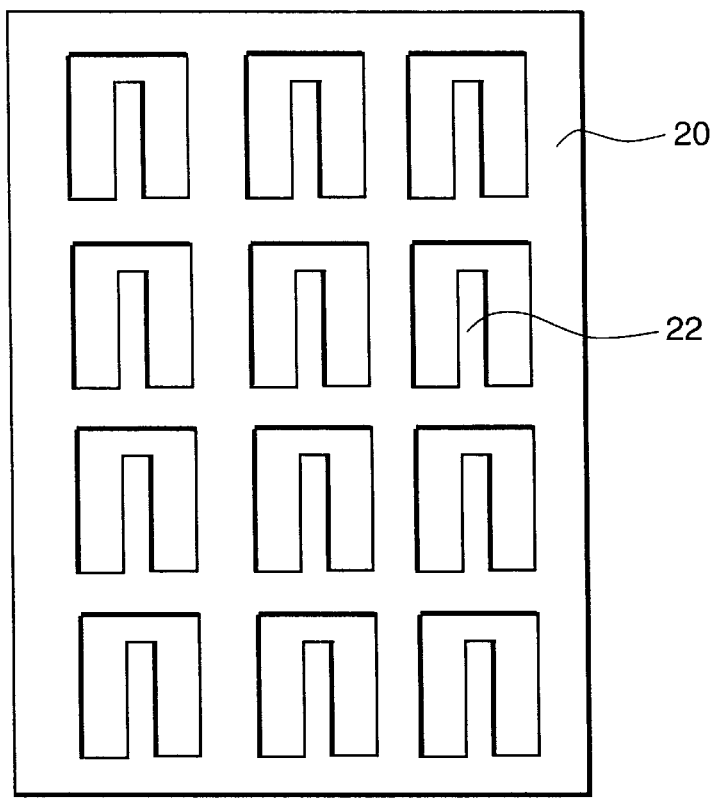
FIG. 8 shows in schematic representation a contact plate having a plurality of single raised contact fingers.

FIG. 8 illustrates a contact plate 20 having a plurality of single raised contact fingers 22. The apparatus 1 of the present invention can further comprise a contact plate having a plurality of differently shaped flexible contact fingers 22, as discussed below.

Figure 9:
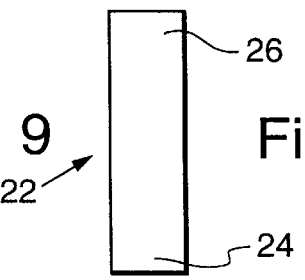
FIG. 9 shows in schematic representation a single raised contact finger having a rectangular shape.

The flexible contact fingers 22 illustrated in FIGS. 3 through 8 each consist of a single, rectangular flexible contact finger 22 extending from the contact plate 20. This flexible contact finger 22 is also shown in FIG. 9. The flexible contact fingers of the present invention also include different flexible contact finger shapes, such as those shown in FIGS. 10, 11, 12A, 12B, and 12C.

The flexible contact finger 22 illustrated in FIG. 9 has an attached region 24 and a contact region 26. The attached region 24 of the contact finger 22 fixes the contact finger 22 to the contact plate 20. The contact region 26 extends away from the contact plate 20 and is at an angle with the plane of the contact plate 20. In the engaged position, the pins 18 are contacted by the contact region 26 of the contact finger 22, typically at the pin extremity. As used in this application, "extremity" refers to the terminal or end portion of the pin 18.

Figure 10:
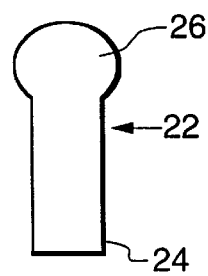
FIG. 10 shows in schematic representation a single raised contact finger having a tapered head.

FIG. 10 illustrates a flexible contact finger 22 having an attached region 24 and a tapered contact region 26. In the engaged position, the pins 18 are contacted by the tapered contact region 26 of the contact fingers 22, typically at the pin extremity.

Figure 11:
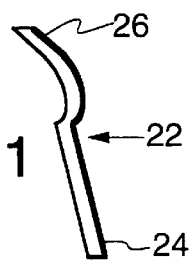
FIG. 11 shows in schematic representation a winged contact finger.

FIG. 11 illustrates a flexible contact finger 22 having a winged shape, and having an attached region 24 and a contact region 26. The winged contact finger 22 is formed on the contact plate 20 such that the attached region 24 is fixed to the contact plate 20 and the contact region 26 extends from the contact plate 20 at an angle with the plane of the contact plate 20. In the disengaged position, the pin 18 is inserted such that the pin 18 does not contact the contact finger 22. Next, when contact is desired, the pin 18 is positioned such that it contacts the contact region 26 of the winged contact finger 22. In the engaged position, the pins 18 are typically contacted by the winged contact finger 22 at the pin side surfaces.

Figure 12A:
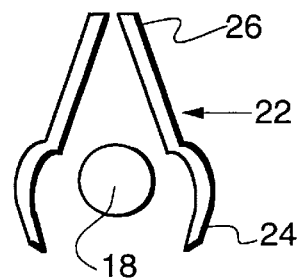
FIGS. 12A, 12B, and 12C show in schematic representation dual raised contact fingers, and a pin in a disengaged position, engaged position, and disengaged position, respectively.
Figure 12B:
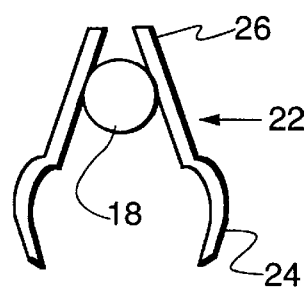
Figure 12C:
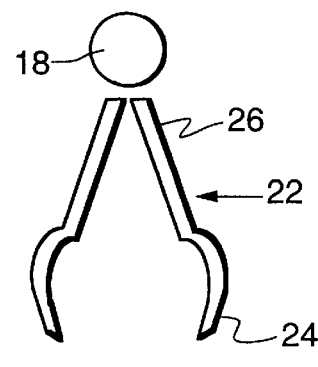

FIGS. 12A, 12B, and 12C illustrate a dual flexible contact finger 22, having an attached region 24 and a contact region 26. This contact finger 22 is formed on the contact plate 20 such that the attached region 24 is fixed to the contact plate 20 and the contact region 26 extends from the contact plate 20 at an angle with the plane of the contact plate 20. FIG. 12A illustrates a pin 18 in a disengaged position. In the disengaged position, the pin 18 is inserted between the attached regions 24 of the contact finger 22 such that the pin 18 does not contact the contact finger 22.

Next, when contact is desired, the pin 18, the contact finger 22, or both components is or are moved in a substantially lateral direction to an engaged position, contacting the contact regions 26 of the dual contact fingers 22, as illustrated in FIG. 12B. In the engaged position, the pins 18 are typically contacted by the dual flexible contact fingers 22 at the pin side surfaces. Following electroplating, the pin 18 is then moved in a lateral direction to disengage the pin 18. Preferably, as illustrated in FIG. 12C, in disengaging the pin 18, the pin 18, the contact finger 22, or both components is or are moved in the same lateral direction as the direction of movement from the first disengaged position to the engaged position.

Although illustrated and described above with reference to specific embodiments, the present invention is nevertheless not intended to be limited to the details shown. Rather, various modifications may be made in the details within the scope and range of equivalents of the claims and without departing from the spirit of the invention. It is to be understood, for example, that the contact plate 20 of the present invention can comprise any or all of the varying flexible contact fingers 22 as described above.

What is claimed is:

1. An apparatus for electroplating comprising:
a contact plate defining a plane and having a plurality of electrically conductive contact fingers: (a) extending from said contact plate away from said plane, (b) positioned to engage a plurality of pins from a pin grid array during an electroplating process, and (c) adapted to flex when contacted by said pins.

2. The apparatus of claim 1 wherein said contact fingers are positioned such that each contact finger contacts one pin of said plurality of pins of said pin grid array at an extremity of said pin.

3. The apparatus of claim 1 wherein said contact fingers are positioned such that two contact fingers contact one pin of said plurality of pins of said pin grid array at a side surface of said pin.

4. The apparatus of claim 1 wherein said contact fingers are positioned such that each contact finger contacts one pin of said plurality of pins of said pin grid array at a side surface of said pin.

5. The apparatus of claim 1 further comprising:
 a carrier frame holding said contact plate and said pin grid array device; and
 a positioning system holding said pins in contact with said contact fingers.

6. The apparatus of claim 1 wherein said contact fingers each have an attached region at which said contact fingers are attached to said contact plate, and a contact region extending away from said contact plate.

7. The apparatus of claim 6 wherein said contact region of said contact fingers is tapered.

8. The apparatus of claim 6 wherein said contact region of said contact fingers extends away from said contact plate at an angle.

9. A contact plate comprising:
 a sheet of electrically conductive metal; and
 a plurality of flexible contact fingers each integral with and extending from said sheet and spaced to engage one pin of a plurality of pins of a pin grid array during an electroplating process.

10. The contact plate of claim 9 wherein said flexible contact fingers are positioned such that each contact finger contacts one pin of said plurality of pins of said pin grid array at an extremity of said pin.

11. The contact plate of claim 9 wherein said flexible contact fingers are positioned such that two flexible contact fingers contact one pin of said plurality of pins of said pin grid array at a side surface of said pin.

12. The contact plate of claim 9 wherein said flexible contact fingers are positioned such that each contact finger contacts one pin of said plurality of pins of said pin grid array at a side surface of said pin.

13. The contact plate of claim 9 further comprising a means for holding said integrated circuit package on said contact plate.

14. The contact plate of claim 13 wherein said means for holding also displaces the pins in a direction that flexes said contact fingers.

15. The contact plate of claim 13 wherein said means for holding comprises a clamp.

* * * * *